(12) United States Patent
Li et al.

(10) Patent No.: US 9,930,787 B2
(45) Date of Patent: Mar. 27, 2018

(54) FILM THICKNESS REGULATOR AND MANUFACTURING METHOD THEREOF, FILM THICKNESS REGULATING METHOD AND EVAPORATION APPARATUS

(71) Applicant: BOE TECHNOLOGY GROUP CO., LTD., Beijing (CN)

(72) Inventors: Xiaohu Li, Beijing (CN); Zhongyuan Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/149,573

(22) Filed: May 9, 2016

(65) Prior Publication Data

US 2017/0037507 A1 Feb. 9, 2017

(30) Foreign Application Priority Data

Aug. 5, 2015 (CN) .......................... 2015 1 0475626

(51) Int. Cl.
| | |
|---|---|
| *C23C 14/54* | (2006.01) |
| *H05K 3/14* | (2006.01) |
| *C23C 14/24* | (2006.01) |
| *C23C 14/04* | (2006.01) |

(52) U.S. Cl.
CPC ........... *H05K 3/146* (2013.01); *C23C 14/042* (2013.01); *C23C 14/24* (2013.01); *C23C 14/542* (2013.01)

(58) Field of Classification Search
None
See application file for complete search history.

(56) References Cited

U.S. PATENT DOCUMENTS

| | | | | |
|---|---|---|---|---|
| 2003/0094133 | A1* | 5/2003 | Yoshidome | C23C 16/4481 118/715 |
| 2004/0086639 | A1* | 5/2004 | Grantham | C23C 14/044 427/248.1 |
| 2004/0142625 | A1* | 7/2004 | Freeman | C23C 14/042 445/60 |
| 2005/0104014 | A1* | 5/2005 | Gurovich | B41J 2/415 250/493.1 |
| 2012/0027682 | A1 | 2/2012 | Neumann et al. | |

FOREIGN PATENT DOCUMENTS

| | | |
|---|---|---|
| CN | 1624191 | 6/2005 |
| JP | 61-15964 | 1/1986 |

\* cited by examiner

*Primary Examiner* — Joseph A Miller, Jr.
(74) *Attorney, Agent, or Firm* — Harness, Dickey & Pierce, P.L.C.

(57) ABSTRACT

A film thickness regulator and its manufacturing method, a regulating method, an evaporation apparatus are disclosed. The film thickness regulator comprises a frame and at least two deformable thin films disposed therein, the film surfaces of which are parallel to each other; each deformable thin film is provided with conductive structures and via holes for molecules of an evaporation coating material to pass through; when voltages are applied to the conductive structures of any two deformable thin films, due to the attraction or repulsion between the conductive structures, the two deformable thin films are moved, and the relative positions of the via holes of any two deformable thin films change, thus solving the problem that the uniformity of the thickness of the evaporation coating film is poor in the related art, and achieving the effect of improving the uniformity of the thickness of the evaporation coating film.

18 Claims, 12 Drawing Sheets

Adhere conductive structures and driving lines onto the base substrate formed with the thin film layer to obtain the deformable thin film to be formed —50121b
Fig. 5-13
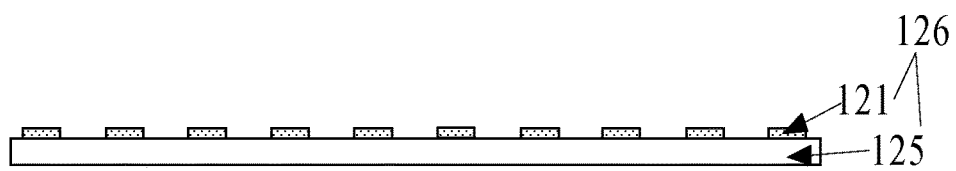
Fig. 5-14
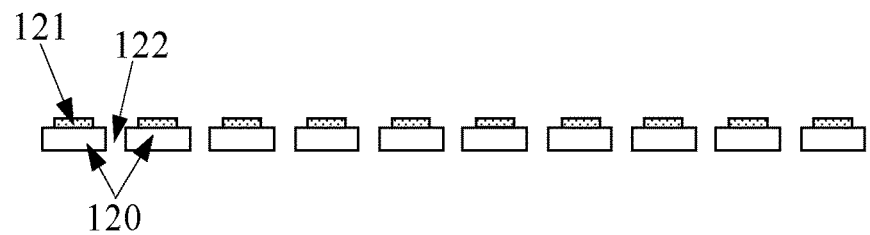
Fig. 5-15

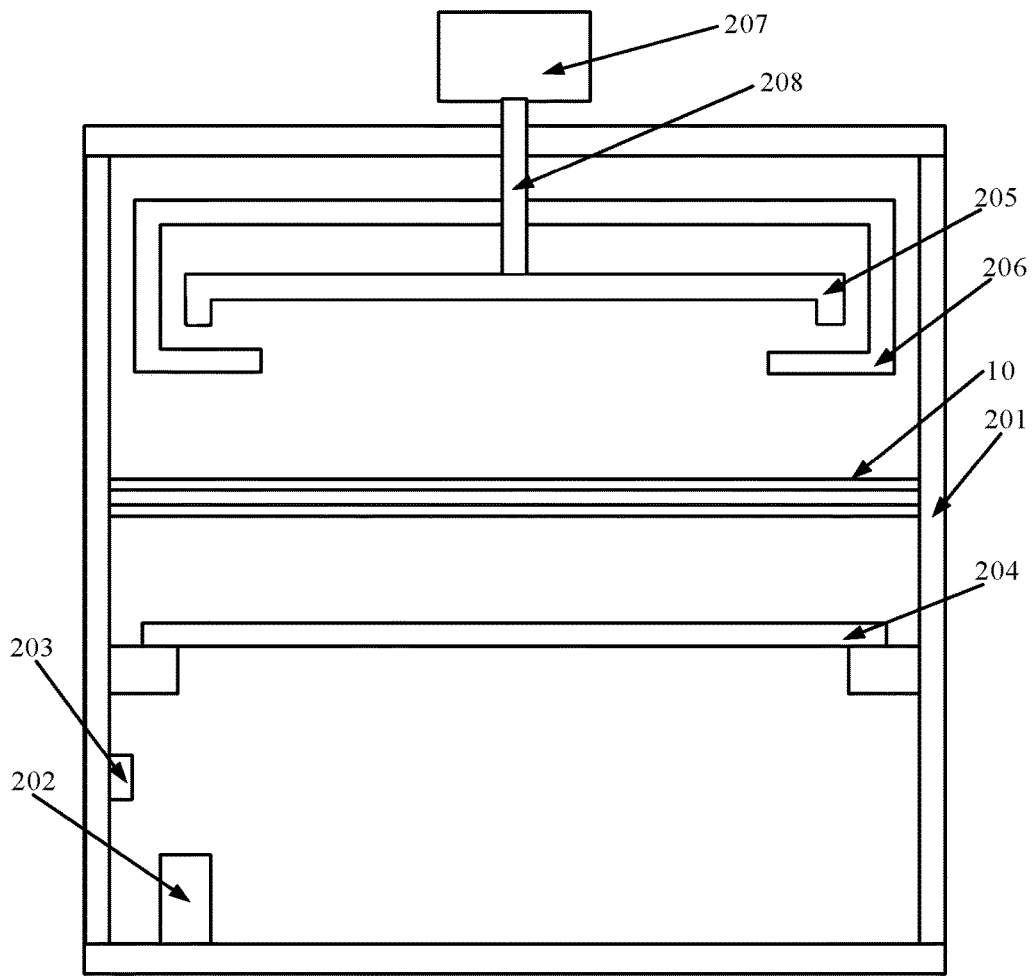

FILM THICKNESS REGULATOR AND MANUFACTURING METHOD THEREOF, FILM THICKNESS REGULATING METHOD AND EVAPORATION APPARATUS

CROSS-REFERENCE TO RELATED APPLICATION

This application claims the benefit and priority of Chinese Patent Application 201510475626.2 filed Aug. 5, 2015. The entire disclosure of the above application is incorporated herein by reference.

FIELD

The present disclosure relates to the technical filed of evaporation coating, more particularly, to a film thickness regulator and manufacturing method thereof, a regulating method, and an evaporation apparatus.

BACKGROUND

This section provides background information related to the present disclosure which is not necessarily prior art.

Organic light-emitting diode (OLED) display is gaining popularity due to a number of advantages. An OLED display device usually comprises: an anode layer, functional film layers, and a cathode layer, etc., wherein the functional film layers may include: a hole transmission layer, an organic light emitting layer, and an electronic transmission layer. Film forming methods of the organic light emitting layer may include: an evaporation coating film forming method, molecular beam epitaxy, an organic chemical vapor deposition method and sol-gel process, etc. The evaporation coating film forming method has the advantages of simple operation and easiness to control film thickness, and has become a major method of forming functional film layers like organic light emitting layer.

A film formed by the evaporation coating film forming method are called an evaporation coating film, and different thickness of the evaporation coating film will cause different luminous intensity of the OLED display device, thus affecting the display effect and service life of the OLED display device. The evaporation coating film forming method usually forms an evaporation coating film by an evaporation apparatus. Schematically, FIG. 1 shows a structural schematic view of an evaporation apparatus 00 provided by related art. As shown, the evaporation apparatus 00 comprises: an evaporation coating chamber 001, an evaporation source 002 disposed in the evaporation coating chamber 001, a thickness detector 003 disposed on an inner wall of the evaporation coating chamber 001 and above the evaporation source 002, a switch 004 disposed in the evaporation coating chamber 001 and above the thickness detector 003, a substrate supporting rack 005 disposed in the evaporation coating chamber 001 for supporting a substrate A to be coated, a mask board supporting rack 006 disposed in the evaporation coating chamber 001 for supporting a mask board B, and a motor 007 disposed external to the evaporation coating chamber 001. The motor 007 is connected to the substrate supporting rack 005 and the mask board supporting rack 006 respectively through a transmission shaft 008 penetrating through the chamber wall of the evaporation coating chamber 001, wherein the evaporation source 002 may be a point evaporation source, and the mask board B is disposed at the side of the substrate A to be coated facing the evaporation source 002. When the evaporation apparatus 00 is used to form an evaporation coating film, the evaporation source 002 is heated to make the evaporation source 002 evaporate gaseous molecules of the evaporation coating material, and the deposition rate of the molecules of the evaporation coating material can be detected by the film thickness detector 003; when the deposition rate of the molecules of the evaporation coating material reaches a target rate, the switch 004 and motor 007 are turned on, and the motor 007 brings the substrate supporting rack 005 and the mask board supporting rack 006 to rotate through the transmission shaft 008, so as to make the substrate A to be coated and the mask board B to rotate, and the molecules of the evaporation coating material are evaporated and deposited onto the substrate A to be coated to form an evaporation film through the mask board B.

The inventor has found out that the related art at least has the following problem: limited by the structures of the dot evaporation source and the substrate, the deposition rate of the molecules of the evaporation coating material is different at different positions of the substrate, and the formed evaporation coating film is prone to have the phenomenon of being thick near the center and being thin near the periphery, and thus the uniformity of the thickness of the evaporation coating film is poor.

SUMMARY

This section provides a general summary of the disclosure, and is not a comprehensive disclosure of its full scope or all of its features.

In order to solve the problem that the uniformity of the thickness of the evaporation coating film in the related technology is poor, embodiments of the present disclosure provide a film thickness regulator and a manufacturing method thereof, a regulating method, and an evaporation apparatus. The technical solutions are as follows:

In one aspect, there is provided a film thickness regulator, and the film thickness regulator comprises a frame and at least two deformable thin films;

the at least two deformable thin films are disposed in the frame, and the film surfaces of the at least two deformable thin films are parallel to each other; each of the at least two deformable thin films is provided with conductive structures and via holes for molecules of an evaporation coating material to pass through;

when voltages are applied to the conductive structures of any two deformable thin films in the at least two deformable thin films, due to the attraction or repulsion between the conductive structures on the two deformable thin films, the two deformable thin films are moved, and the relative positions of the via holes on the two deformable thin films change.

Optionally, each deformable thin film is provided with a plurality of conductive structures arranged in an array and a plurality of via holes arranged in an array.

Optionally, each deformable thin film is further provided with a plurality of driving lines, and the plurality of driving lines are connected to the plurality of conductive structures in a one-to-one correspondence.

Optionally, the structure of each deformable thin film in the at least two deformable thin films is the same.

Optionally, the conductive structures and the via holes on each deformable thin film are arranged alternately.

Optionally, the film surface of each deformable thin film is a rectangular plane;

the frame is a rectangular frame, and the least two deformable thin films are sequentially arranged in the frame along the height direction of the frame.

Optionally, the conductive structures and the via holes on each deformable thin film are arranged alternately along the length direction of the deformable thin film; or the conductive structures and the via holes on each deformable thin film are arranged alternately along the width direction of the deformable thin film.

Optionally, the conductive structures and the driving lines are both made of a metal material.

Optionally, the number of the at least two deformable thin films is 2;

the via holes are circular via holes or square via holes.

Optionally, the film thickness regulator is used in an evaporation apparatus.

In a second aspect, there is provided a method of manufacturing a thin film regulator, and the method of manufacturing the thin film regulator comprises:

manufacturing at least two deformable thin films, each of the at least two deformable thin films is provided with conductive structures and via holes for molecules of an evaporation coating material to pass through;

disposing the at least two deformable thin films in a frame to make the film surfaces of the at least two deformable thin films parallel to each other.

Optionally, each of the deformable thin film is further provided with driving lines connected to the conductive structures, and the manufacturing the at least two deformable thin films comprises:

forming a thin film layer on a base substrate;

forming the conductive structures and the driving lines on the base substrate formed with the thin film layer, to obtain a deformable thin film to be formed;

stripping off the deformable thin film to be formed from the base substrate;

making holes in the regions other than the conductive structures and the driving lines on the deformable thin film to be formed, so as to form via holes on the deformable thin film to be formed to obtain a first deformable thin film, the first deformable thin film being any one of the at least two deformable thin films.

Optionally, the forming the conductive structures and the driving lines on the base substrate formed with the thin film layer, to obtain a deformable thin film to be formed comprises:

sequentially forming a metal layer and a photoresist layer on the base substrate formed with the thin film layer;

by exposing and developing the base substrate formed with the photoresist layer with a mask board, forming photoresist patterns which comprise photoresist regions and photoresist-free regions;

removing the metal layer corresponding to the photoresist-free regions by an etching process;

stripping off the photoresist in the photoresist regions, so that the regions of the metal layer corresponding to the photoresist regions form the conductive structures and the driving lines, to obtain the deformable thin film to be formed.

Optionally, the forming the conductive structures and the driving lines on the base substrate formed with the thin film layer, to obtain a deformable thin film to be formed comprises:

adhering the conductive structures and the driving lines onto the base substrate formed with the thin film layer, to obtain the deformable thin film to be formed.

Optionally, the forming the thin film layer on the base substrate comprises:

coating a layer of a deformable material on the base substrate to obtain the thin film layer; or, adhering a thin film formed by a deformable material onto the base substrate to obtain the thin film layer.

Optionally, the making holes in the regions other than the conductive structures and the driving lines on the deformable thin film to be formed comprises:

punching holes in the regions other than the conductive structures and the driving lines on the deformable thin film to be formed by laser punching; or, making holes in the regions other than the conductive structures and the driving lines on the deformable thin film to be formed by mechanical punching.

Optionally, the film surface of each deformable thin film is a rectangular plane, and the frame is a rectangular frame, the disposing the least two deformable thin films in the frame to make the film surfaces of the at least two deformable thin film parallel to each other comprises:

disposing the at least two deformable thin films in the frame to make the at least two deformable thin films arranged in the frame sequentially along the height direction of the frame, and the film surfaces of the at least two deformable thin films being parallel to each other.

In a third aspect of the present disclosure, there is provided a method of regulating film thickness, wherein the method of regulating film thickness comprises:

applying voltages to conductive structures on any two deformable thin films in at least two deformable thin films, making the conductive structures on the two deformable thin films mutually attracted or repulsed, so that the two deformable thin films are moved, and the relative positions of the via holes on the two deformable thin films change, thus changing the amount of the evaporation coating material passing through the via holes, and thereby changing the rate of deposition of the evaporation coating material on the substrate to be coated.

Optionally, each deformable thin film is provided with a plurality of conductive structures arranged in an array and a plurality of via holes arranged in an array, and each deformable thin film is provided with a plurality of driving lines, the plurality of driving lines being connected to the plurality of conductive structures in a one-to-one correspondence, the applying voltages to the conductive structures of any two deformable thin films in the at least two deformable thin films comprises:

applying voltages to the conductive structures on the two deformable thin films by the driving lines connected to the conductive structures on the two deformable thin films.

Optionally, the applying voltages to the conductive structures on any two deformable thin films in at least two deformable thin films, making the conductive structures on the two deformable thin films mutually attracted or repulsed, so that the two deformable thin films are moved, comprises:

applying voltages of the same direction to the conductive structures on any two deformable thin films in the at least two deformable thin films, making the conductive structures on the two deformable thin films mutually repulsed, so that the neighboring regions of the conductive structures on the two deformable thin films move away from each other; or, applying voltages of the opposite directions to the conductive structures on any two deformable thin films in the at least two deformable thin films, making the conductive structures on the two deformable thin films mutually attracted, so that the neighboring regions of the conductive structures on the two deformable thin films move towards each other.

Optionally, each deformable thin film is provided with a plurality of conductive structures arranged in an array and a plurality of via holes arranged in an array, the applying voltages to the conductive structures on any two deformable thin films in at least two deformable thin films, making the conductive structures on the two deformable thin films mutually attracted or repulsed, so that the two deformable thin films are moved, comprises:

applying voltages of the same direction and voltages of the opposite directions to the plurality of conductive structures at different corresponding positions on the two deformable thin films alternately, making the plurality of conductive structures at different corresponding positions on the two deformable thin films mutually attracted and repulsed alternately, so that the two deformable thin films move away from and move towards each other alternatively at different corresponding positions.

Optionally, the applying voltages to the conductive structures on any two deformable thin films in at least two deformable thin films, comprises:

applying voltages to the conductive structures at positions on the two deformable thin films where more evaporation coating material is received, and not applying voltages to the conductive structures at positions on the two deformable thin films where less evaporation coating material is received.

In a fourth aspect, there is provided an evaporation apparatus, and the evaporation apparatus comprises the film thickness regulator of any one of the first aspect or the second aspect.

Optionally, the evaporation apparatus further comprises: an evaporation coating chamber, an evaporation source disposed in the evaporation coating chamber, a thickness detector disposed on an inner wall of the evaporation coating chamber and above the evaporation source, a switch disposed in the evaporation coating chamber and above the thickness detector, a first supporting rack and a second supporting rack disposed in the evaporation coating chamber, and a motor disposed external to the evaporation coating chamber, the first supporting rack and the second supporting rack are connected to the motor through a transmission shaft penetrating through the chamber wall of the evaporation coating chamber respectively; the first supporting rack is for supporting a substrate to be coated, and the second supporting rack is for supporting a mask board;

the film thickness regulator is fixed within the evaporation coating chamber and is above the switch and below the second supporting rack, and the film thickness regulator is for regulating the deposition rate of molecules of an evaporation coating material on the substrate to be coated by regulating the relative positions of the via holes on any two deformable thin films in the at least two deformable thin films of the film thickness regulator.

Optionally, the evaporation apparatus is configured to:

apply voltages of the same direction and voltages of the opposite directions to the plurality of conductive structures at different corresponding positions on the two deformable thin films alternately, making the plurality of conductive structures at different corresponding positions on the two deformable thin films mutually attracted and repulsed alternately, so that the two deformable thin films move away from and move towards each other alternatively at different corresponding positions.

Optionally, the evaporation apparatus is further configured to:

apply voltages to the conductive structures at positions on the two deformable thin films where more evaporation coating material is received, and not apply voltages to the conductive structures at positions on the two deformable thin films where less evaporation coating material is received.

The advantageous effects brought by the technical solutions of the present disclosure are as follows:

Embodiments of the present disclosure provide a film thickness regulator and a manufacturing method thereof, a regulating method, and an evaporation apparatus. The film thickness regulator comprises: a frame and at least two deformable thin films; the at least two deformable thin films are disposed in the frame, and the film surfaces of the at least two deformable thin films are parallel to each other; each of the at least two deformable thin films is provided with conductive structures and via holes for molecules of an evaporation coating material to pass through; when voltages are applied to the conductive structures of any two deformable thin films in the at least two deformable thin films, due to the attraction or repulsion between the conductive structures, the two deformable thin films are moved, and the relative positions of the via holes of the two deformable thin films change. When the relative positions of the via holes of the two deformable thin films change, the amount of the evaporation coating material passing through the via holes may be regulated, so that the deposition rates of the evaporation coating material at different positions of the substrate to be coated may be regulated, so as to make the thickness of the evaporation coating film at different positions of the substrate to be coated uniform, thus solving the problem that the uniformity of the thickness of the evaporation coating film in the related technology is poor, and achieving the effect of improving the uniformity of the thickness of the evaporation coating film.

It should be understood that the general description above and the detailed description below are merely exemplary, and cannot limit the present disclosure.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3-1 is a structural schematic view of a film thickness regulator provided by another embodiment of the present disclosure;

FIG. 3-2 is a structural schematic view of the film thickness regulator provided by the embodiment shown in FIG. 3-1 after voltages are applied to the conductive structures thereon;

FIG. 3-3 is a top view of the film thickness regulator provided by the embodiment shown in FIG. 3-1;

FIG. 5-1 is a flowchart of a manufacturing method of a film thickness regulator provided by another embodiment of the present disclosure;

FIG. 5-2 is a top view of a deformable thin film provided by an embodiment of the present disclosure;

FIG. 5-3 is a cross sectional view at position C-C of the deformable thin film shown in FIG. 5-2;

FIG. 5-4 is a flowchart of a manufacturing method of the deformable thin film provided by the embodiment shown in FIG. 5-1;

FIG. 5-5 is a structural schematic view after forming the thin film layer on the base substrate provided by the embodiment shown in FIG. 5-1;

FIG. 5-6 is a structural schematic view after forming conductive structures and driving lines on the base substrate formed with the thin film layer provided by the embodiment shown in FIG. 5-1;

FIG. 5-7 is a top view of FIG. 5-6;

FIG. 5-8 is a flowchart of a method of forming conductive structures and driving lines on a base substrate formed with a thin film layer provided by the embodiment shown in FIG. 5-1;

FIG. 5-9 is a structural schematic view of sequentially forming the metal layer and the photoresist layer on the base substrate formed with the thin film layer provided by the embodiment shown in FIG. 5-1;

FIG. 5-10 is a structural schematic view after exposing and developing the base substrate formed with the photoresist layer provided by the embodiment shown in FIG. 5-1;

FIG. 5-11 is a structural schematic view after removing the metal layer corresponding to the photoresist-free regions provided by the embodiment shown in FIG. 5-1;

FIG. 5-12 is a structural schematic view after stripping off the photoresist in the photoresist regions provided by the embodiment shown in FIG. 5-1;

FIG. 5-13 is a flowchart of another method of forming conductive structures and driving lines on the base substrate formed with the thin film layer provided by the embodiment shown in FIG. 5-1;

FIG. 5-14 is a structural schematic view after the deformable thin film to be formed is stripped off from the base substrate provided by the embodiment shown in FIG. 5-1;

FIG. 5-15 is a structural schematic view after the deformable thin film to be formed is punched with holes provided by the embodiment shown in FIG. 5-1;

FIG. 6 is a flowchart of a method of regulating film thickness provided by an embodiment of the present disclosure;

FIG. 7 is a structural schematic view of an evaporation apparatus provided by an embodiment of the present disclosure;

FIG. 8 is a diagram of the working principles of an evaporation apparatus provided by an embodiment of the present disclosure.

Figure 1:
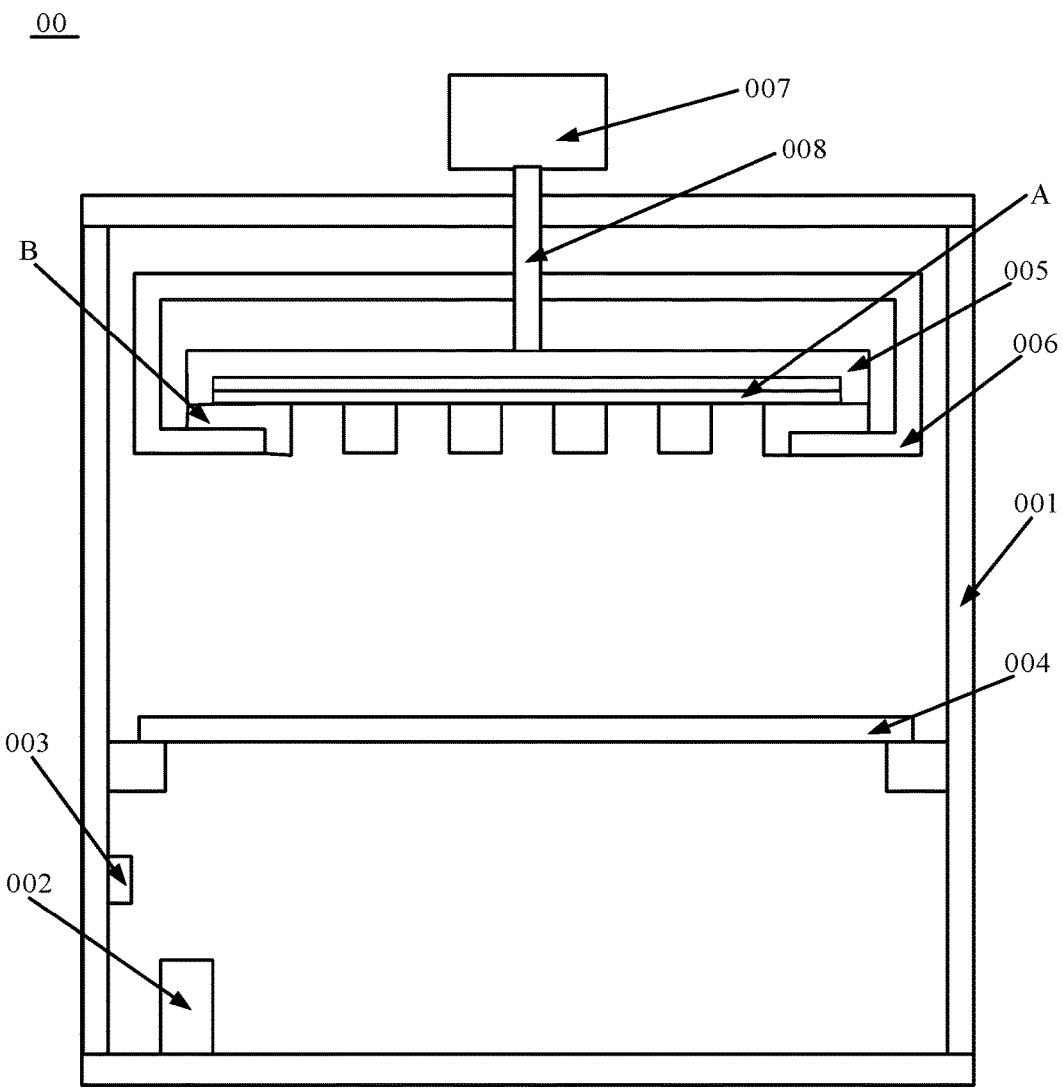
FIG. 1 is a structural schematic view of an evaporation apparatus provided by related technology.

Here the accompanying drawings are incorporated into the specification and form a part of the specification, in order to illustrate embodiments in accordance with the present disclosure and to interpret the principles of the present disclosure together with the description.

Corresponding reference numerals indicate corresponding parts or features throughout the several views of the drawings.

DETAILED DESCRIPTION

Example embodiments will now be described more fully with reference to the accompanying drawings.

Figure 2:
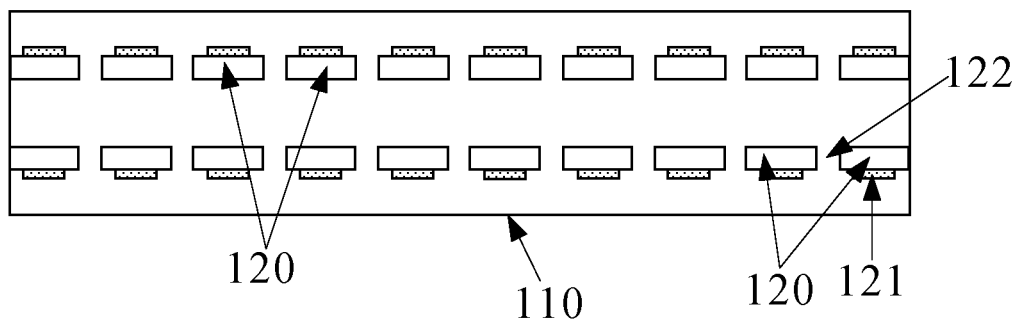
FIG. 2 is a structural schematic view of a film thickness regulator provided by an embodiment of the present disclosure.

Referring to FIG. 2, it shows a structural schematic view of a film thickness regulator 10 provided by an embodiment of the present disclosure. The film thickness regulator 10 may be provided in an evaporation apparatus to regulate the uniformity of thickness of the evaporation coating film; referring to FIG. 1, the film thickness regulator 10 comprises a frame 110 and at least two deformable thin films 120.

The at least two deformable thin films 120 are disposed in the frame 110, and the film surfaces of the at least two deformable thin films 120 are parallel to each other; each deformable thin film 120 in the at least two deformable thin films 120 is provided with conductive structures 121 and via holes 122 for molecules of an evaporation coating material to pass through.

When voltages are applied to the conductive structures 120 on any two deformable thin films 120 in the at least two deformable thin films 120, due to the attraction or repulsion between the conductive structures 121 on the two deformable thin films, the two deformable thin films are moved, and the relative positions of the via holes 122 on the two deformable thin films 120 change.

To sum up, the film thickness regulator provided by an embodiment of the present disclosure comprises: a frame and at least two deformable thin films; the at least two deformable thin films are parallel to each other; each of the deformable thin films is provided with conductive structures and via holes; when voltages are applied to the conductive structures of any two deformable thin films, due to the attraction or repulsion between the conductive structures, the two deformable thin films are moved, and the relative positions of the via holes on the two deformable thin films change; when the relative positions of the via holes on the two deformable thin films change, the amount of the evaporation coating material passing through the via holes may be regulated, thus regulating the deposition rates of the evaporation coating material at different positions of the substrate to be coated, so that the thickness of the evaporation coating film at different positions of the substrate to be coated may be made uniform, solving the problem that the uniformity of thickness of the evaporation coating film is poor in the related art, and achieving the effect of improving the uniformity of thickness of the evaporation coating film.

Figures 1, 3:
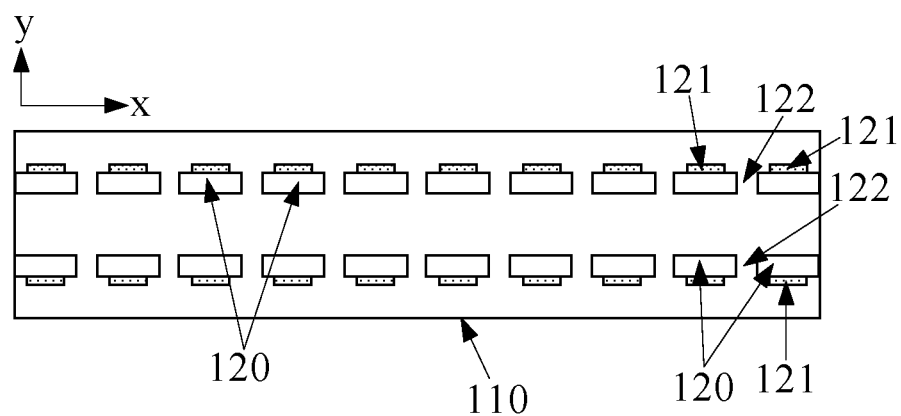
Figures 2, 3:
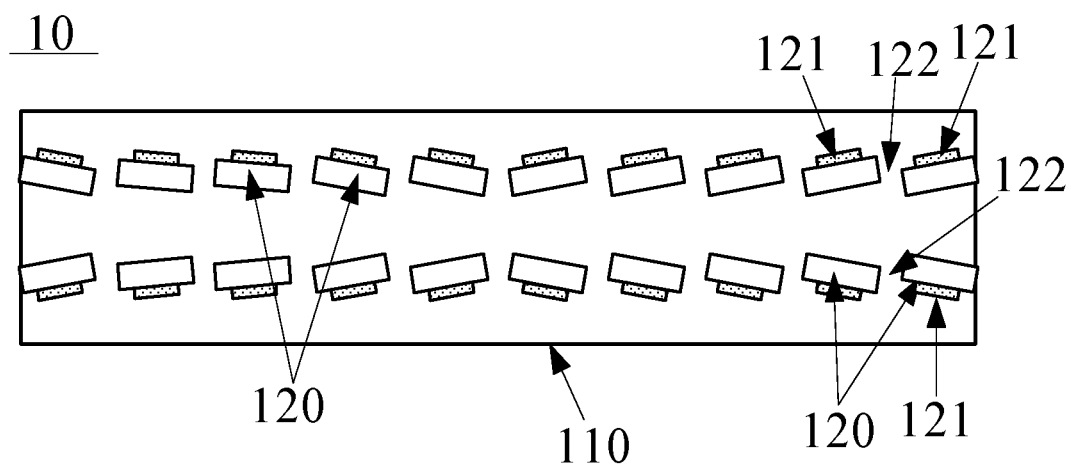
Figure 3:
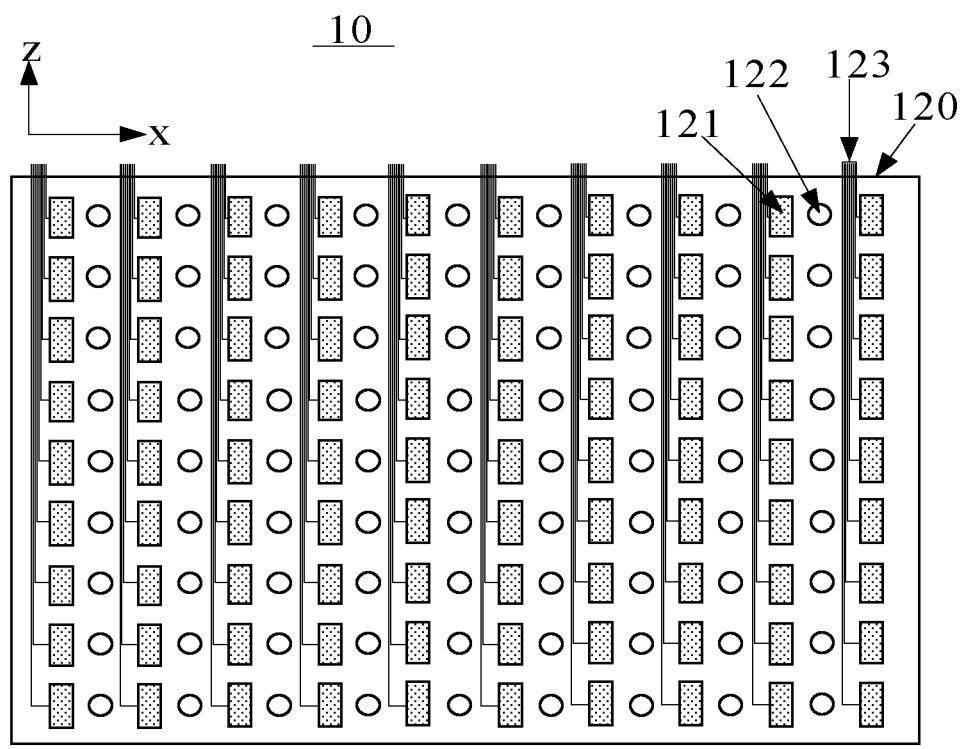

Referring to FIG. 3-1, it shows a structural schematic view of a film thickness regulator 10 provided by another embodiment of the present disclosure. The film thickness regulator 10 may be disposed in an evaporation apparatus to regulate the uniformity of thickness of the evaporation coating film. Referring to FIG. 3-1, the film thickness regulator 10 comprises: a frame 110 and at least two deformable thin films 120. This embodiment is described by taking as an example that the at least two deformable thin films 120 are two deformable thin films.

The at least two deformable thin films 120 are disposed in the frame 110, and the film surfaces of the at least two deformable thin films 120 are parallel to each other; each deformable thin film 120 in the at least two deformable thin films 120 is provided with conductive structures 121 and via holes 122 for molecules of an evaporation coating material to pass through.

When voltages are applied to the conductive structures 121 on any two deformable thin films 120 in the at least two deformable thin films 120, due to the attraction or repulsion of the conductive structures 121 on the two deformable thin films, the two deformable thin films 120 are moved, and the relative positions of the via holes 122 on the two deformable thin films 120 change.

For example, referring to FIG. 3-2, it shows a structural schematic view of the film thickness regulator 10 after voltages are applied to the constructive structures 121; referring to FIG. 3-2, after voltages are applied to the conductive structures 121, the conductive structures 121 are mutually attracted or repulsed, so that the relative positions of the via holes 122 on the two deformable thin films 120 change. Specifically, after voltages of the same direction are applied to the conductive structures 121 on the two deformable thin films 120, the conductive structures 121 are mutually repulsed, so that the relative positions of the via holes 122 of the two deformable thin films 120 change; after voltages of the opposite directions are applied to the conductive structures 121 on the two deformable thin films 120, the conductive structures 121 are mutually attracted, so that the relative positions of the via holes 122 of the two deformable thin films 120 change.

For example, voltages of the same direction and voltages of the opposite directions may be applied to the plurality of conductive structures at different corresponding positions on the two deformable thin films alternately (i.e. alternately in space), making the plurality of conductive structures at different corresponding positions on the two deformable thin films mutually attracted and repulsed alternately, so that the two deformable thin films move away from and move towards each other alternatively at different corresponding positions.

Optionally, still referring to FIG. 3-1, each deformable thin film 120 is provided with a plurality of conductive structures 121 arranged in an array and a plurality of via holes 122 arranged in an array.

Optionally, each deformable thin film 120 is further provided with a plurality of driving lines (not depicted in FIG. 3-1), and the plurality of driving lines are connected to the plurality of conductive structures 121 in a one-to-one correspondence. That is, each conductive structure 121 on each deformable thin film 120 is connected with a driving line. Therein, the driving lines are for applying voltages to the conductive structures 121 connected to the driving lines in a one-to-one correspondence, that is, in the practical application, when voltages are applied to the conductive structures 121, the driving lines may be connected to an external circuit, so as to apply voltages to the conductive structures 121. The one-to-one connections between the plurality of driving lines and the plurality of conductive structures 121 allow that a different voltage can be applied to each conductive structure 121, and that the relative positions of the via holes 122 of any two deformable thin films 120 can change differently, so that the amount of the evaporation coating material passing through each via hole 122 can be the same, and the deposition rates of the evaporation material at different positions of the substrate to be coated can be the same, so that the evaporation coating film at different positions of the substrate to be coated can have a uniform thickness.

For example, voltages of the same direction or voltages of the opposite direction may be applied to the conductive structures at positions on the any two deformable thin films where more evaporation coating material is received (e.g., positions close to the centers of the deformable thin films), so that the relative positions of the via holes 122 around the positions on the two deformable thin films may change, thus reducing the amount of the evaporation coating material passing through the via holes 122 around the positions; and no voltage is applied to the conductive structures at positions on the any two deformable thin films where less evaporation coating material is received (e.g., positions close to the peripheries of the deformable thin films), so that the amount of the evaporation coating material passing through the via holes 122 around the positions keeps unchanged. In this way, the amounts of the evaporation coating material passing through the via holes around different positions on the two deformable thin films 120 tend to be the same, thus making the deposition rates of the evaporation coating material at different positions of the substrate to be coated tend to be the same, so as to make the thickness of the evaporation coating film at different positions of the substrate to be coated tends to be uniform.

Optionally, the structure of each deformable thin film 120 in the at least two deformable thin films 120 is the same. The conductive structures 121 and the via holes 122 on each deformable thin film 120 are arranged alternately. By arranging the conductive structures 121 and the via holes 122 alternately, when the conductive structures 121 on two deformable thin films are mutually repulsed or attracted, the relative positions of the via holes 122 adjacent to the conductive structures 121 on the two deformable thin films 120 can be changed effectively, realizing the effective regulation of the amount of the evaporation material passing through each via hole 122, as well as the deposition rates of the evaporation material at different positions of the substrate to be coated.

Optionally, the film surface of each deformable thin film 120 is a rectangular plane; the frame 110 is a rectangular frame, and the top surface of the frame 110 is a rectangle the same as the film surface of the deformable thin film 120. As shown in FIG. 3-1, at least two deformable thin films 120 are sequentially arranged in the frame 110 along the height direction of the frame 110, wherein when frame 110 is disposed in the evaporation apparatus, the height direction y of the frame 110 and the height direction of the evaporation apparatus are parallel to each other. Optionally, when the film surface of the deformable thin film 120 is a rectangular plane, the conductive structures 121 and the via holes 122 on each deformable thin film 120 may be arranged alternately along the length direction x of the deformable thin film; or the conductive structures 121 and the via holes 122 on each deformable thin film 120 may be arranged alternately along the width direction of the deformable thin film 120 (not depicted in FIG. 3-1).

Optionally, the conductive structures 121 and the driving lines are both made of a metal material. For example, the conductive structures 121 and the driving lines may be both formed by depositing metal and by a patterning process; still for example, the conductive structures 121 and the driving lines may be both formed by adhering, i.e., adhering metal pieces onto each deformable thin film 120 as conductive structures 121, and adhering metal lines as driving lines.

Optionally, as shown in FIG. 3-1, the number of the at least two deformable thin films 120 is 2; the via holes 12 may be circular via holes or square via holes, and the present disclosure has no limitation in this respect. Of course, it is also contemplated that the number of the at least two deformable thin films is 3 or more.

Referring to FIG. 3-3, it shows a top view of the film thickness regulator 10 provided by the embodiment shown in FIG. 3-1. Therein, the frame may be rectangular frame, the deformable thin film 120 may be a rectangular thin film, and the film surface of the deformable thin film may be the same as the top surface of the frame. Thus, the frame is not shown in FIG. 3-3. Referring to FIG. 3-3, the deformable thin film 120 may be a rectangular thin film, and the length direction of the deformable thin film 120 is x, and the width direction is z; the deformable thin film 120 is provided with a plurality of conductive structures 121 arranged in an array and a plurality of via holes arranged in an array, and driving lines 123 connected to the plurality of conductive structures 121 in a one-to-one correspondence; the conductive structures 121 and the driving lines 123 are both made of a metal material, and the driving lines 123 are for applying voltages to the conductive structures 121 connected to the driving lines 123 in a one-to-one correspondence. Therein, as shown in FIG. 3-3, the conductive structures 121 and the via holes 122 on the deformable thin film 120 are arranged alternately along the length direction x of the deformable thin film. It should be noted that this embodiment is described by taking as an example that the conductive structures 121 and the via holes are arranged alternately along the length direction x of the deformable thin film 120; in the practical application, the conductive structures 121 and the via holes 122 may also be arranged alternately along the width direction z of the deformable thin films 120. Or, the conductive structures 121 and the via holes 122 may also be arranged alternately along other directions, and this embodiment has no limitation in this respect. It should be noted that FIG. 3-3 takes as an example that the via holes 122 are circular via holes for illustration, while in the practical application, the via holes 122 may be square via holes or via holes of other shapes. The present disclosure has no limitation in this respect.

To sum up, the film thickness regulator provided by the embodiment of the present disclosure comprises: a frame and at least two deformable thin films; the at least two deformable thin films are parallel to each other, and each of the deformable thin films is provided with conductive structures and via holes; by applying voltages to the conductive structures of any two deformable thin films, the conductive structures are mutually attracted or repulsed, so that the two deformable thin films are moved, and the relative positions of the via holes of the two deformable thin films change; when the relative positions of the via holes change, the amount of the evaporation material passing through the via holes may be regulated, thus regulating the deposition rates of the evaporation material at different positions of the substrate to be coated, so as to make the thickness of the evaporation coating film at different positions of the substrate to be coated uniform, thus solving the problem that the uniformity of the thickness of the evaporation coating film is poor in the related art, and achieving the effect of improving the uniformity of the thickness of the evaporation coating film.

The film thickness regulator provided by embodiments of the present disclosure can be applied in the method described below. For a manufacturing method of the film thickness regulator and a film thickness regulating method in embodiments of the present disclosure, reference may be made to the description of embodiments below.

Figure 4:
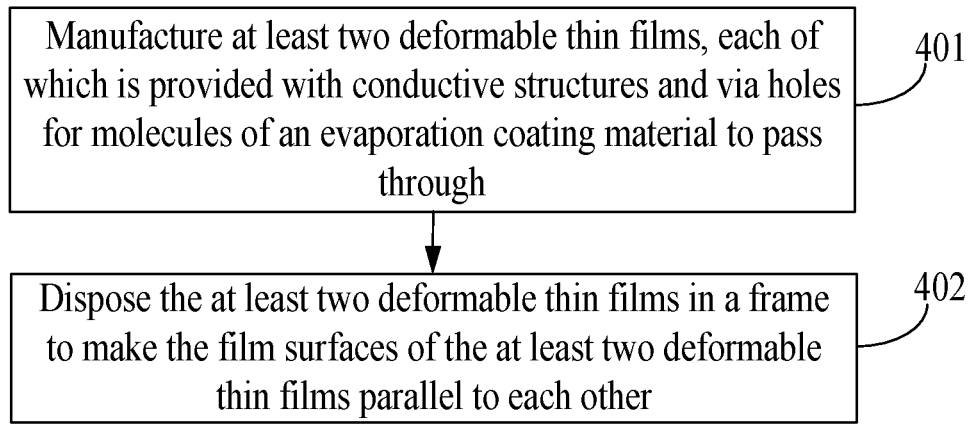
FIG. 4 is a flowchart of a manufacturing method of a film thickness regulator provided by an embodiment of the present disclosure.

Referring to FIG. 4, it shows a flowchart of a manufacturing method of a film thickness regulator provided by an embodiment of the present disclosure. The manufacturing method of a film thickness regulator may be used to manufacture the film thickness regulator 10 as shown in FIG. 2 or FIG. 3-1; referring to FIG. 4, the manufacturing method of a film thickness regulator comprises the following steps:

In step 401, at least two deformable thin films are manufactured, each deformable thin film of the at least two deformable thin films being provided with conductive structures and via holes for molecules of an evaporation coating material to pass through.

In step 402, the at least two deformable thin films are disposed in a frame, so that the film surfaces of the at least two deformable thin films are parallel to each other.

To sum up, the manufacturing method of a film thickness regulator provided by embodiment of the present disclosure manufactures at least two deformable thin films, each of which is provided with conductive structures and via hoes, and disposes the at least two deformable thin films in a frame, making the film surfaces of the at least two deformable thin films parallel to each other. When voltages are applied to the conductive structures of any two deformable thin films, due to the mutual attraction or repulsion of the conductive structures on the two deformable thin film, the two deformable thin films are moved, and the relative positions of the via holes of the two deformable thin films change; when the relative positions of the via holes of the two deformable thin films change, the amount of the evaporation coating material passing through the via holes is regulated, thus regulating the deposition rates of the evaporation coating material at different positions of the substrate to be coated, so as to make the thickness of the evaporation coating film at different positions of the substrate to be coated uniform, thus solving the problem that the uniformity of the thickness of the evaporation coating film is poor in the related art, and achieving the effect of improving the uniformity of the thickness of the evaporation coating film.

Optionally, each deformable thin film is further provided with driving lines connected to the conductive structures, and step 401 may comprise:

forming a thin film layer on a base substrate;

forming conductive structures and driving lines on the base substrate formed with the thin film layer, to obtain a deformable thin film to be formed;

stripping off the deformable thin film to be formed from the base substrate;

making holes in the regions other than the conductive structures and driving lines on the deformable thin film to be formed to form via holes on the deformable thin film to be formed, to obtain a first deformable thin film, and the first deformable thin film is any one of at least two deformable thin films.

Optionally, forming conductive structures and the driving lines on the base substrate formed with the thin film layer to obtain a deformable thin film to be formed comprises:

sequentially forming a metal layer and a photoresist layer on the base substrate formed with the thin film layer;

exposing and developing the base substrate formed with the photoresist layer by a mask board, thus forming photoresist patterns which comprise photoresist regions and photoresist-free regions;

removing the metal layer corresponding to the photoresist-free regions by an etching process;

stripping off the photoresist in the photoresist regions, so that the conductive structures and the driving lines are formed on the regions of the metal layer corresponding to the photoresist regions, to obtain the deformable thin film to be formed.

Optionally, forming the conductive structures and the driving lines on the base substrate formed with the thin film layer to obtain a deformable thin film to be formed comprises:

adhering the conductive structures and the driving lines onto the base substrate formed with the thin film layer, to obtain the deformable thin film to be formed.

Optionally, forming the thin film layer on the base substrate comprises:

coating a layer of a deformable material on the base substrate to obtain the thin film layer; or, adhering a thin film formed by a deformable material onto the base substrate to obtain the thin film layer.

Optionally, the making holes in the regions other than the conductive structures and the driving lines on the deformable thin film to be formed comprises:

making holes in the regions other than the conductive structures and the driving lines on the deformable thin film to be formed by laser punching; or, making holes in the regions other than the conductive structures and the driving lines on the deformable thin film to be formed by mechanical punching.

Optionally, the film surface of each deformable thin film is a rectangular plane, the frame is a rectangular frame, and step 402 may comprise:

disposing the at least two deformable thin films in the frame to make the at least two deformable thin films sequentially arranged in the frame along the height direction of the frame, and the film surfaces of the at least two deformable thin films are parallel to each other.

All the above optional features may combine in any way to form optional embodiments of the present disclosure, which are not repeated here.

To sum up, the manufacturing method of a film thickness regulator provided by embodiment of the present disclosure manufactures at least two deformable thin films, each of which is provided with conductive structures and via hoes, disposes the at least two deformable thin films in a frame, making the film surfaces of the at least two deformable thin films parallel to each other. When voltages are applied to the conductive structures of any two deformable thin films, due to the mutual attraction or repulsion of the conductive structures on the two deformable thin films, the two deformable thin films are moved, and the relative positions of the via holes of the two deformable thin films change; when the relative positions of the via holes change, the amount of the evaporation coating material passing through the via holes may be regulated, thus regulating the deposition rates of the evaporation coating material at different positions of the substrate to be coated, so that the thickness of the evaporation coating films at different positions of the substrate to be coated may be made uniform, thus solving the problem that the uniformity of the thickness of the evaporation coating film is poor in the related art, and achieving the effect of improving the uniformity of the thickness of the evaporation coating film.

Figures 1, 5:
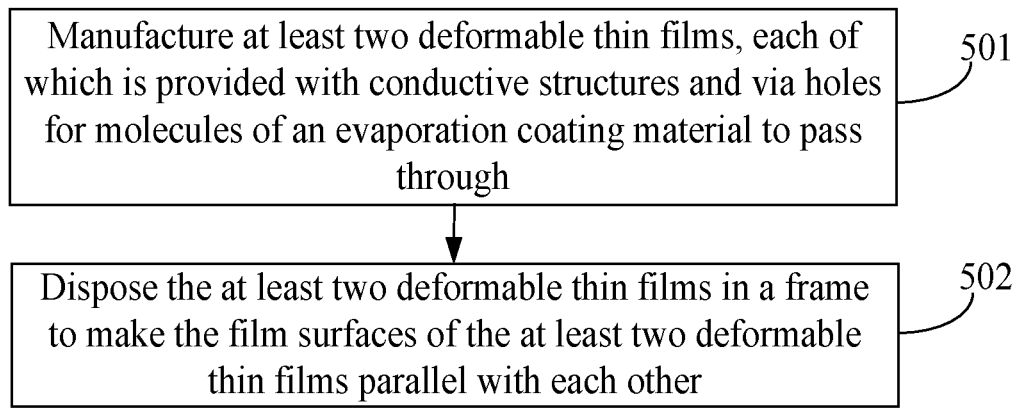
Figures 2, 5:
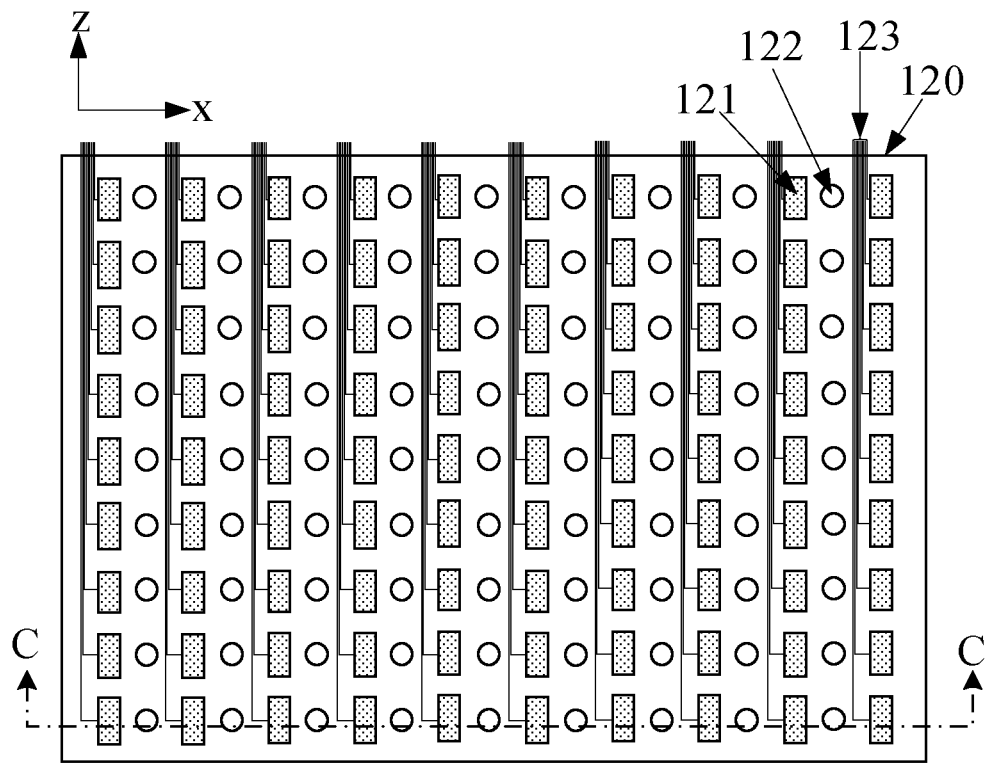
Figures 3, 5:
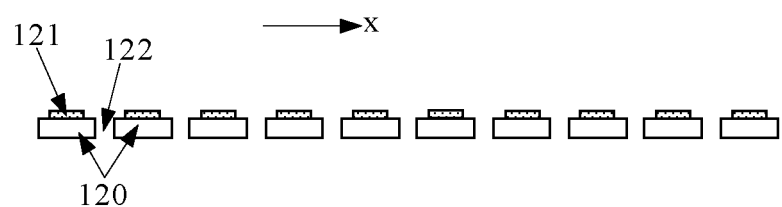
Figures 4, 5:
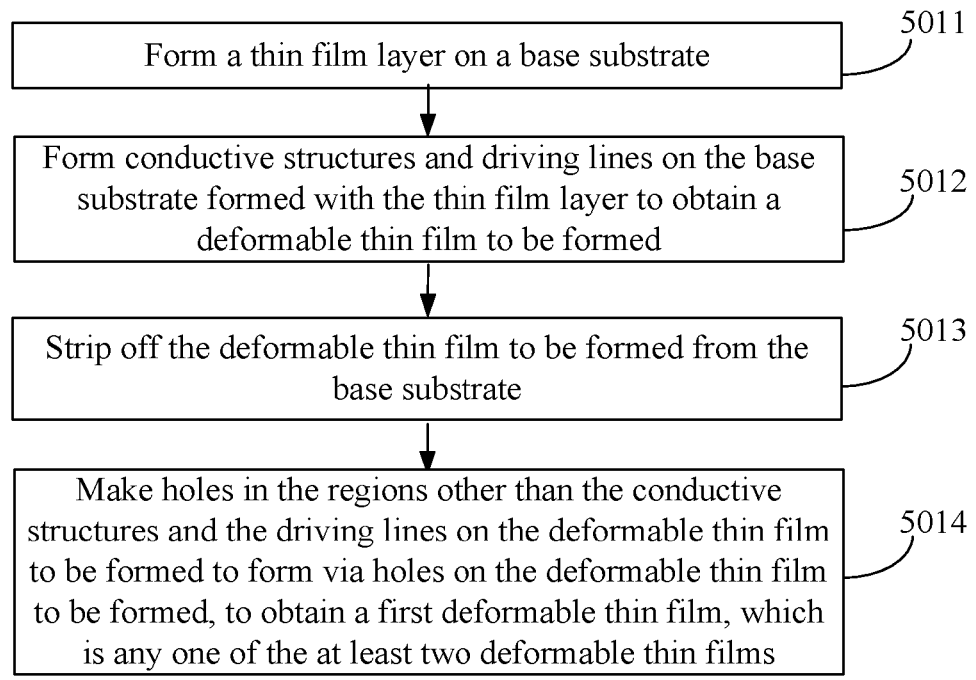
Figure 5:
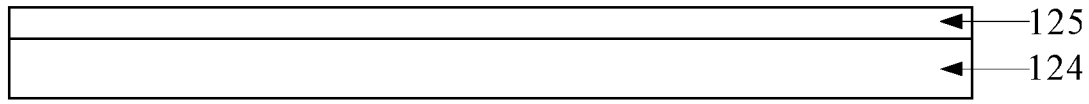

Referring to FIG. 5-1, it shows a flowchart of a manufacturing method of a film thickness regulator provided by another embodiment of the present disclosure. The manufacturing method of a film thickness regulator may be used to manufacture the film thickness regulator 10 shown in FIG. 2 or FIG. 3-1; referring to FIG. 5-1, the manufacturing method of a film thickness regulator may comprise the following steps:

In step 501, at least two deformable thin films are manufactured, each of which is provided with conductive structures and via holes for molecules of an evaporation coating material to pass through.

Referring to FIG. 5-2, it shows a top view of a deformable thin film 120 provided by an embodiment of the present disclosure. As shown in FIG. 5-2, the deformable thin films 120 may be a rectangular thin film, and the length direction of the deformable thin film 120 may be denoted as x, while the width direction z; the deformable thin film 120 is provided with a plurality of conductive structures 121 arranged in an array and a plurality of via holes 122 arranged in an array for molecules of an evaporation coating material to pass through, and the conductive structures 121 and the via holes 122 are arranged alternately along the length direction x of the deformable thin film 120; the deformable thin film 120 is also provided with driving lines 123 connected to the plurality of conductive structures 121 in a one-to-one correspondence, and the driving lines 123 are for applying voltages to the conductive structures 121 connected to the driving lines 123 in a one-to-one correspondence; referring to FIG. 5-3, it shows a cross sectional view at position C-C of the deformable thin film 120 shown in FIG. 5-2; as shown in FIG. 5-3, the plurality of conductive structures 121 and the plurality of via holes 122 on the deformable thin film 120 are arranged alternately along the length direction x of the deformable thin film 120.

Referring to FIG. 5-4, it shows a flowchart of a manufacturing method of a deformable thin film provided by the embodiment shown in FIG. 5-1; as shown in FIG. 5-4, the method may comprise the following steps:

In sub-step 5011, a thin film layer is formed on a base substrate.

Referring to FIG. 5-5, it shows a schematic view after forming a thin film layer 125 on a base substrate 124 provided by the embodiment shown in FIG. 5-1. Therein, the base substrate 124 may be a transparent substrate, which may be a substrate specifically made of a light guiding and non-metal material having certain firmness, such as glass, quartz, and transparent resin. For example, a layer of a deformable material may be coated on the base substrate 124, and after a baking process, a thin film layer 125 may be obtained; or, a thin film formed of a deformable material may be adhered directly onto the base substrate 124 to obtain the thin film layer 125. The present disclosure has no limitation in this respect.

In sub-step 5012, conductive structures and driving lines are formed on the base substrate formed with the thin film layer to obtain a deformable thin film to be formed.

Figures 5, 6:
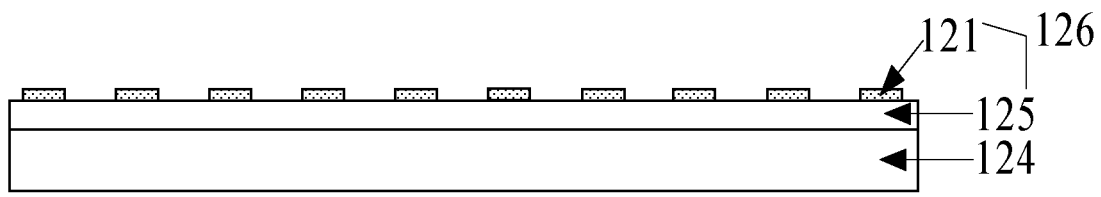

Referring to FIG. 5-6, it shows a structural schematic view of forming conductive structures 121 and driving lines (not depicted in FIG. 5-6) on the base substrate 124 formed with the thin film layer 125 to obtain a deformable thin film 126 to be formed provided by the embodiment shown in FIG. 5-1. As shown in FIG. 5-6, a plurality of conductive structures 121 are arranged in an array on the thin film layer 125; referring to FIG. 5-7, which is a top view of FIG. 5-6, the top surface of the base substrate may be a rectangle, and the top surface of the formed thin film layer 125 may also be a rectangle. The length direction of the thin film layer 125 may be denoted as x, and the width direction z; on the thin film layer 125, a plurality of conductive structures 121 arranged in an array, as well as driving lines 123 connected to the plurality of conductive structures 121 in a one-to-one correspondence, are formed.

In an embodiment of the present disclosure, there are two ways of forming conductive structures 121 and driving lines on the base substrate 124 formed with the thin film layer 125:

The first way: forming conductive structures 121 and driving lines on the base substrate 124 formed with a thin film layer 125 by a patterning process; specifically, referring to FIG. 5-8, it shows a method flowchart of forming conductive structures 121 and driving lines on the base substrate 124 formed with a thin film layer 125 provided by the embodiment shown in FIG. 5-1; as shown in FIG. 5-8, the method may comprise the following steps:

in sub-step 50121a, sequentially forming a metal layer and a photoresist layer on a base substrate formed with a thin film layer.

Referring to FIG. 5-9, it shows a structural schematic view after sequentially forming a metal layer 127 and a photoresist layer 128 on a base substrate 124 formed with a thin film layer 125 provided by the embodiment shown in FIG. 5-1. Specifically, first a layer of a metal material with a certain thickness may be deposited as a metal layer 127 on the base substrate 124 by means of coating, magnetron sputtering, hot evaporation or plasma enhanced chemical vapor deposition (PECVD), etc., and then a photoresist layer 128 may be formed on the base substrate 124 formed with the metal layer 127 by means of coating, magnetron sputtering, hot evaporation or plasma enhanced chemical vapor deposition (PECVD), etc.

In sub-step 50122a, photoresist patterns are formed after exposing and developing the base substrate formed with the photoresist layer by a mask board, and the photoresist patterns include: photoresist regions and photoresist-free regions.

Referring to FIG. 5-10, it shows a structural schematic view after the photoresist patterns 129 are formed by exposing and developing the base substrate 124 formed with the photoresist layer 128 by using the mask board provided by the embodiment shown in FIG. 5-1, wherein the photoresist patterns 129 may include: photoresist regions 1291 and photoresist-free regions 1292. Specifically, first the base substrate 124 formed with the photoresist layer 128 is exposed by an exposure process using a mask board, to make the photoresist layer 128 form complete exposure regions and non-exposure regions, the complete exposure regions corresponding to the photoresist-free regions 1292, while the non-exposure regions being the photoresist regions 1291; then a development process is performed on the photoresist layer 128 with a developer to make the photoresist layer 128 form photoresist patterns 129.

In sub-step 50123a, the metal layer corresponding to the photoresist-free regions is removed by an etching process.

Referring to FIG. 5-11, it shows a structural schematic view after the metal layer 127 corresponding to the photoresist-free regions 1292 is removed by using an etching process provided by the embodiment shown in FIG. 5-1. Specifically, the metal layer 127 corresponding to the photoresist-free regions 1292 is removed by etching with an etching liquid, and after the metal layer 127 corresponding to the photoresist-free regions 1292 is removed, the remaining part of the metal layer 127 is the conductive structures and the driving lines.

In sub-step 50124a, the photoresist in the photoresist regions is stripped off, so that conductive structures and driving lines are formed by the regions of the metal layer corresponding to the photoresist regions, to obtain the deformable thin film to be formed.

Referring to FIG. 5-12, it shows a structural schematic view after stripping off the photoresist on the photoresist regions 1291, so that conductive structures 121 and driving lines (not depicted in FIG. 5-12) are formed by the regions of the metal layer 127 corresponding to the photoresist regions 1291 to obtain a deformable thin film 126 to be formed provided by the embodiment shown in FIG. 5-1. Therein it should be noted that since the remaining part of the metal layer 127 is the conductive structures and the driving lines after removing the metal layer 127 corresponding to the photoresist-free regions 1292, FIG. 5-12 directly depicts the conductive structures 121, without depicting the driving lines connected to the conductive structures 121 in a one-to-one correspondence.

The second way: forming conductive structures 121 and driving lines on a base substrate 124 formed with a thin film layer 125 by adhering. Specifically, referring to FIG. 5-13, it shows a flowchart of another method of forming conductive structures 121 and driving lines on a base substrate 124 formed with a thin film layer 125 provided by the embodiment shown in FIG. 5-1. Referring to FIG. 5-13, the method may comprise the following steps:

In sub-step 50121b, conductive structures and driving lines are adhered onto the base substrate formed with the thin film layer to obtain the deformable thin film to be formed.

Referring to FIG. 5-12, it shows a structural schematic view of adhering conductive structures 121 and driving lines onto the base substrate 124 formed with a thin film layer 125 to obtain a deformable thin film 126 to be formed provided by the embodiment shown in FIG. 5-1. Specifically, metal pieces are adhered onto the base substrate 124 formed with the thin film layer 125 as conductive structures 121, and metal wires are adhered as driving lines, and the metal pieces and the metal wires are connected in a one-to-one correspondence.

In sub-step 5013, the deformable thin film to be formed are stripped off from the base substrate.

Referring to FIG. 5-14, it shows a structural schematic view after stripping off the deformable thin film 126 to be formed from the base substrate 124 provided by the embodiment shown in FIG. 5-1. Referring to FIG. 5-14, a plurality of conductive structures 121 arranged in an array are formed on the thin film layer 125.

In sub-step 5014, holes are punched in the regions other than the conductive structures and the driving lines on the deformable thin film to be formed, so as to form via holes on the deformable thin film to be formed to obtain a first deformable thin film, and the first deformable thin film is any one of at least two deformable thin films.

Referring to FIG. 5-15, it shows a structural schematic view of making holes in the regions other than the conductive structures 121 and the driving lines on the deformable thin film 126 to be formed, so as to form via holes 122 on the deformable thin film 126 to be formed to obtain a first deformable thin film 120 provided by the embodiment shown in FIG. 5-15, a plurality of conductive structures 121 and via holes 122 arranged in an array are formed on the deformable thin film 120, and the conductive structures 121 and the via holes 122 are arranged alternately.

Therein, a laser punching or mechanical punching method may be used to punch holes in the regions other than the conductive structures 121 and the driving lines on the deformable thin film to be formed, and the present disclosure has no limitation in this respect.

In step 502, the at least two deformable thin films are disposed in the frame, making the film surfaces of the at least two deformable thin films parallel to each other.

Therein, the film surface of each deformable thin film 120 is a rectangular plane, and the frame 110 may be rectangular frame. Thus, disposing the at least two deformable thin films in the frame making the film surfaces of the at least two deformable thin films parallel to each other may comprise: disposing the at least two deformable thin films 120 in the frame 110, making the at least two deformable thin films 120 sequentially arranged in the frame 110 along the height direction of the frame 110, and the film surfaces of at least two deformable thin films 120 parallel to each other, wherein the height direction of the frame 110 is parallel to the height direction of the evaporation apparatus.

To sum up, the manufacturing method of the film thickness regulator provided by embodiments of the present disclosure manufactures at least two deformable thin films, each of which is provided with conductive structures and via hoes, disposes the at least two deformable thin films in a frame making the film surfaces of the at least two deformable thin films parallel to each other. When voltages are applied to the conductive structures of any two deformable thin films, due to the mutual attraction or repulsion of the conductive structures on the two deformable thin films, the two deformable thin films are moved, and the relative positions of the via holes on the two deformable thin films change, so that the amount of the evaporation coating material passing through the via holes is regulated, thus regulating the deposition rates of the evaporation coating material at different positions of the substrate to be coated, so as to make the thickness of the evaporation coating films at different positions of the substrate to be coated uniform, thus solving the problem that the uniformity of the thickness of the evaporation coating film is poor in the related art, and achieving the effect of improving the uniformity of the thickness of the evaporation coating film.

Referring to FIG. 6, it shows a flowchart of a method of regulating film thickness provided by an embodiment of the present disclosure. The method of regulating film thickness may be used to regulate the thickness of an evaporation coating film. As shown in FIG. 6, the method of regulating film thickness may comprise the following steps:

In step 601, voltages are applied to conductive structures on any two deformable thin films in at least two deformable thin films, the conductive structures on the two deformable thin films are mutually attracted or expulsed, so that the two deformable thin films are moved, and the relative positions of via holes on the two deformable thin films change, thus changing the amount of an evaporation coating material passing through the via holes, and thereby changing the deposition rate of the evaporation coating material on a substrate to be coated.

Specifically, as shown in FIG. 2 or FIG. 3-1, a film thickness regulator 10 comprises the at least two deformable thin films 120; the film surfaces of the at least two deformable thin films 120 are parallel to each other, and each deformable thin film 120 of the at least two deformable thin films 120 is provided with conductive structures 121 and via holes 122 for molecules of an evaporation coating material to pass through. Voltages may be applied to the conductive structures 121 on each deformable thin film 120 in any two deformable thin films in the at least two deformable thin films, making the conductive structures 121 are mutually attracted or repulsed, so that the two deformable thin films 120 are moved, and the relative positions of the via holes 122 on the any two deformable thin films 120 change.

Optionally, as shown in FIG. 3-3, each deformable thin film 120 is provided with a plurality of conductive structures 121 arranged in an array and a plurality of via holes 122 arranged in an array, and each deformable thin film 120 is further provided with a plurality of driving lines 123, which are connected to the plurality of the conductive structures 121 in a one-to-one correspondence. Thus, voltages may be applied to the conductive structures 121 on the two deformable thin films 120 by the driving lines 123 connected to the conductive structures 121 on the two deformable thin films 120 to make the conductive structures 121 on the two deformable thin films 120 mutually attracted or repulsed.

Optionally, the applying voltages to the conductive structures 121 on any two deformable thin films 120 in the at least two deformable thin films 120, making the conductive structures 121 on the two deformable thin films 120 mutually attracted or repulsed, so that the two deformable thin films 120 are moved, and the relative positions of the via holes 122 on the two deformable thin films 120 change may specifically comprise:

applying voltages of the same direction to the conductive structures 121 on any two deformable thin films 120 in the at least two deformable thin films, making the conductive structures 121 on the two deformable thin films mutually repulsed, so that the neighboring regions of the conductive structures 121 on the two deformable thin films 120 move away from each other, and the relative positions of the via holes 122 on the two deformable thin films 120 change; or, applying voltages of opposite directions to the conductive structures 121 on any two deformable thin films 120 in the at least two deformable thin films, making the conductive structures 121 on the two deformable thin films mutually attracted, so that the neighboring regions of the conductive structures 121 on the two deformable thin films 120 move towards each other, and the relative positions of the via holes on 122 the two deformable thin films 120 change; wherein, the neighboring regions of the conductive structures 121 refer to the regions around the conductive structures 121 on the deformable thin films 120.

the applying voltages to the conductive structures on any two deformable thin films 120 in at least two deformable thin films 120, making the conductive structures on the two deformable thin films 120 mutually attracted or repulsed, so that the two deformable thin films are moved, comprises:

applying voltages of the same direction and voltages of the opposite directions to the plurality of conductive structures at different corresponding positions on the two deformable thin films 120 alternately, making the plurality of conductive structures at different corresponding positions on the two deformable thin films 120 mutually attracted and repulsed alternately, so that the two deformable thin films 120 move away from and move towards each other alternatively at different corresponding positions.

Optionally, the applying voltages to the conductive structures on any two deformable thin films 120 in at least two deformable thin films 120, comprises:

applying voltages to the conductive structures at positions on the two deformable thin films 120 where more evaporation coating material is received, and not applying voltages to the conductive structures at positions on the two deformable thin films 120 where less evaporation coating material is received.

To sum up, the method of regulating film thickness provided by the embodiment of the present disclosure, by applying voltages to conductive structures on any two deformable thin films in at least two deformable thin films, make the conductive structures mutually attracted or repulsed to make the two deformable thin films move, and the relative positions of the via holes of any two deformable thin films change; when the relative positions of the via holes change, the amount of the evaporation coating material passing through the via holes is regulated, thus regulating the deposition rates of the evaporation coating material at different positions on the substrate to be coated, so as to make the thickness of the evaporation coating films at different positions of the substrate to be coated uniform, thus solving the problem that the uniformity of the thickness of the evaporation coating film is poor in the related art, and achieving the effect of improving the uniformity of the thickness of the evaporation coating film.

Figures 5, 6, 7:
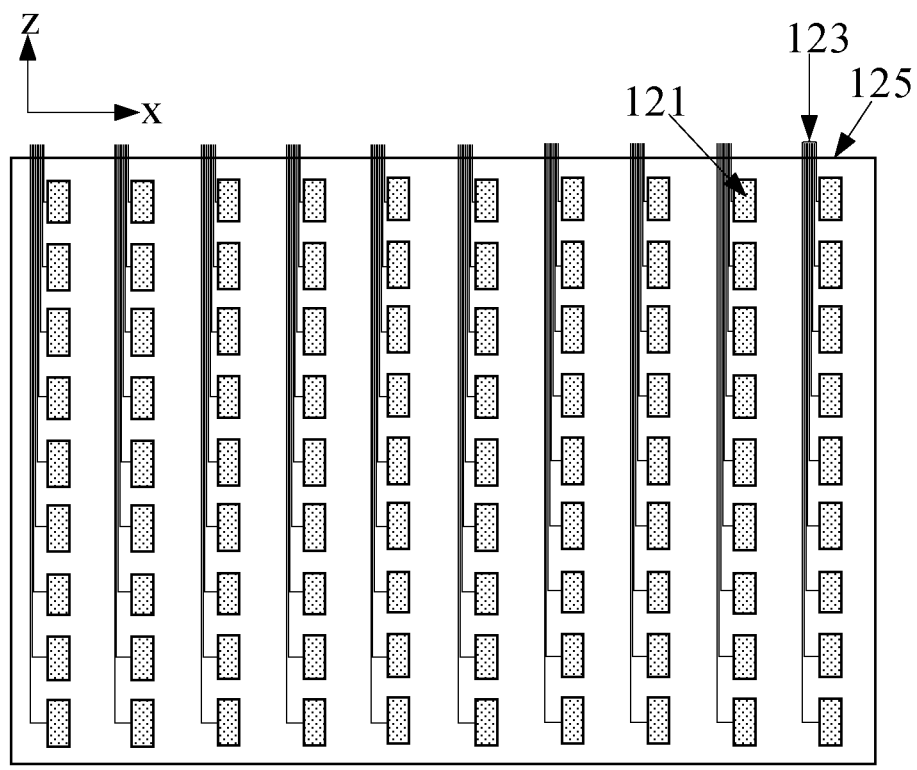

Referring to FIG. 7, it shows a structural schematic view of an evaporation apparatus 20 provided by an embodiment of the present disclosure. The evaporation apparatus may be used to form an evaporation coating film on a substrate to be coated, and the evaporation apparatus 20 may comprise: a film thickness regulator 10 as shown in FIG. 2 or FIG. 3-1.

As shown in FIG. 7, the evaporation apparatus 20 further comprises: an evaporation coating chamber 201, an evaporation source 202 disposed in the evaporation coating chamber, a thickness detector 203 disposed on an inner wall of the evaporation coating chamber 201 and above the evaporation source 202, a switch 204 disposed in the evaporation coating chamber 201 and above the thickness detector 203, a first supporting rack 205 and a second supporting rack 206 disposed in the evaporation coating chamber 201, and motor 207 disposed external to the evaporation coating chamber 201.

Therein, the first supporting rack 205 and the second supporting rack 206 are connected to the motor 207 respectively through a transmission shaft 208 penetrating through the evaporation coating chamber 201; the first supporting rack 205 may be used to support a substrate to be coated, and the second supporting rack 206 may be used to support a mask board.

The film thickness regulator 10 is fixed in the evaporation coating chamber 201 and above the switch 204 and below the second supporting rack 206. The film thickness regulator 10 is for regulating the deposition rate of molecules of the evaporation coating material on the substrate to be coated by regulating the relative positions of the via holes on any two deformable thin films in the at least two deformable thin films of the film thickness regulator 10.

Therein, the evaporation coating chamber 201 may be a vacuum evaporation coating chamber or a non-vacuum evaporation coating chamber, and the present disclosure has no limitation in this respect. The evaporation source 202 is used to form gaseous molecules of the evaporation coating material; when the evaporation source 202 is heated to make the temperature of the evaporation source 202 achieve a preset temperature, the evaporation source 202 may evaporate gaseous molecules of the evaporation coating material, and the thickness detector 203 may detect the deposition rate of the molecules of the evaporation coating material on the substrate to be coated. Specifically, the thickness detector 203 may be a detector formed by a sensor and a processing component; the sensor may detect the rate of molecules of the evaporation coating material passing through the thickness detector 203, and the processing component may calculate the deposition rate of the molecules of the evaporation coating material on the substrate to be coated according to the rate detected by the sensor. The switch 204 may control the start or end of the evaporation coating process; when the thickness detector 203 detects that the deposition rate of the molecules of the evaporation coating material on the substrate to be coated achieves a target rate, it turns on switch 204, and the molecules of the evaporation coating material are deposited to the substrate to be coated fixed on the first supporting rack 205 sequentially through the switch 204, the film thickness regulator 10, and the mask board fixed on the second supporting rack 206.

Optionally, the evaporation apparatus 20 is configured to: apply voltages of the same direction and voltages of the opposite directions to the plurality of conductive structures at different corresponding positions on the two deformable thin films alternately, making the plurality of conductive structures at different corresponding positions on the two deformable thin films mutually attracted and repulsed alternately, so that the two deformable thin films move away from and move towards each other alternatively at different corresponding positions.

Optionally, the evaporation apparatus is further configured to:

apply voltages to the conductive structures at positions on the two deformable thin films 120 where more evaporation coating material is received, and not applying voltages to the conductive structures at positions on the two deformable thin films where less evaporation coating material is received.

To sum up, embodiments of the present disclosure provide an evaporation apparatus, which comprises a film thickness regulator formed by a frame and at least two deformable thin films. By applying voltages to conductive structures on any two deformable thin films in the at least two deformable thin films, the conductive structures are mutually attracted or repulsed to make the two deformable thin films move, and the relative positions of the via holes of two deformable thin films change. When the relative positions of the via holes change, the amount of the evaporation coating material passing through the via holes is regulated, thus regulating the deposition rates of the evaporation coating material at different positions of the substrate to be coated, so as to make the thickness of the evaporation coating films at different positions of the substrate to be coated uniform, thus solving the problem that the uniformity of the thickness of the evaporation coating film is poor in the related art, and achieving the effect of improving the uniformity of the thickness of the evaporation coating film.

Figures 5, 6, 7, 8:
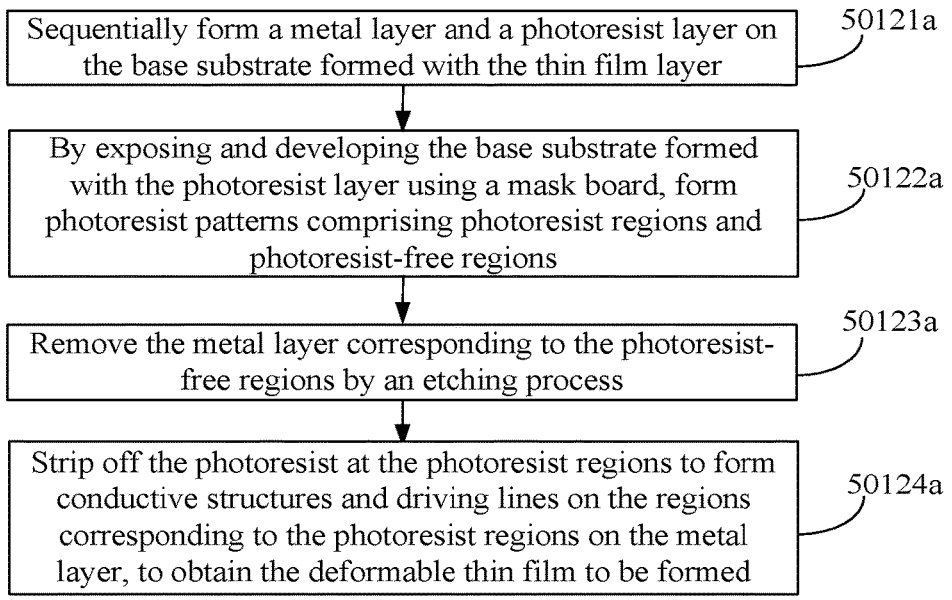
Figures 5, 6, 7, 8, 9:
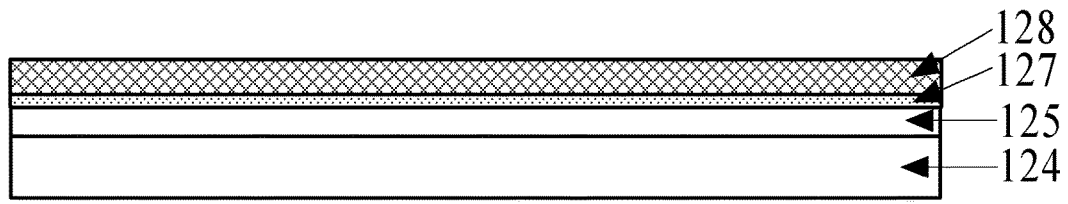
Figures 5, 6, 7, 8, 9, 10:
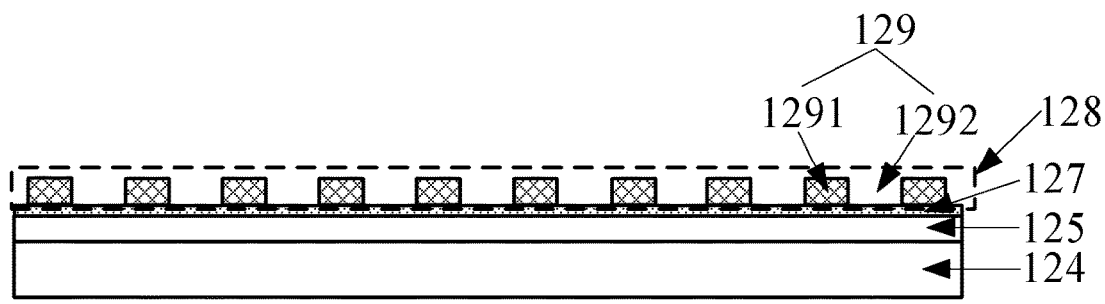
Figures 5, 6, 7, 8, 9, 10, 11:
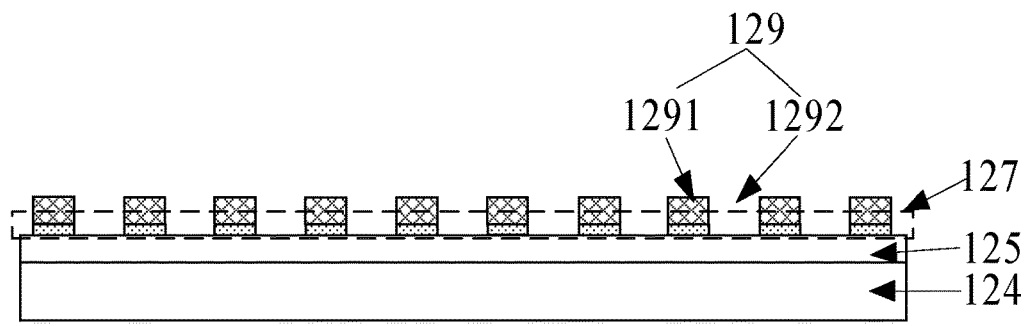
Figures 5, 6, 7, 8, 9, 10, 11, 12:
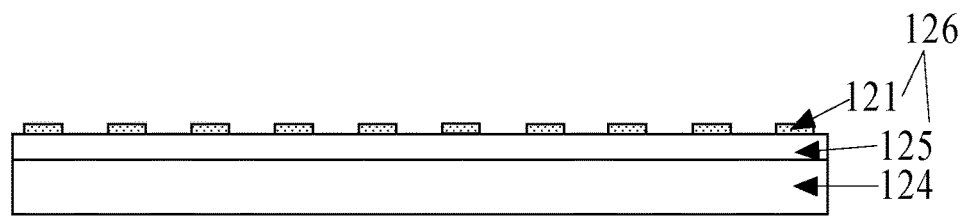
Figure 8:
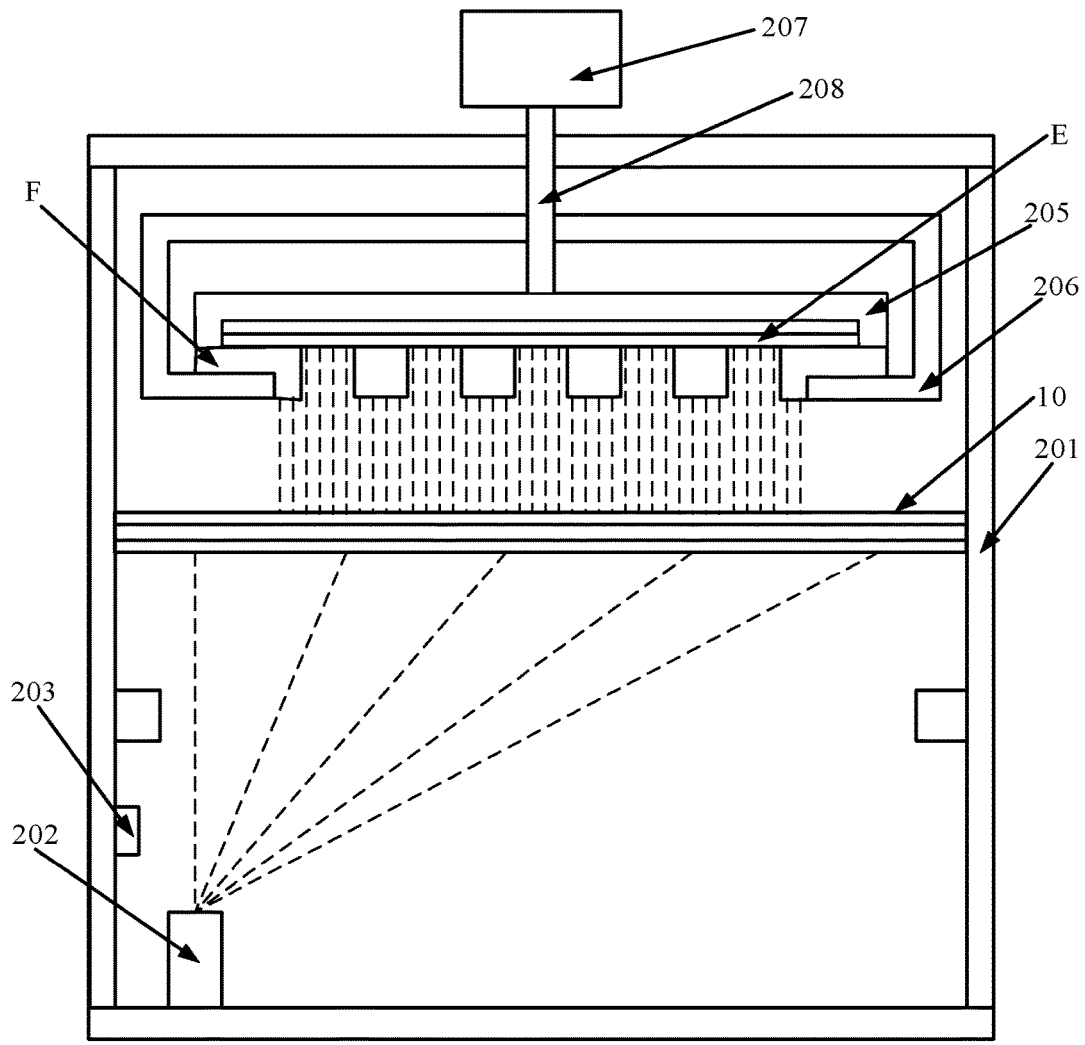

Referring to FIG. 8, it shows a diagram of the working principles of an evaporation apparatus provided by an embodiment of the present disclosure. The evaporation apparatus may be the evaporation apparatus 20 shown in FIG. 7, and the evaporation apparatus 20 may comprise the film thickness regulator 10 shown in FIG. 2 or FIG. 3-1.

As shown in FIG. 8, when the evaporation apparatus 20 works, the substrate E to be coated is fixed in the evaporation coating chamber 201 by the first supporting rack 205, and the mask board F is fixed in the evaporation coating chamber 201 by the second supporting rack 206, so that the mask board F is at the side of the substrate E to be coated facing the evaporation coating source 201. The evaporation source 202 is heated to make the temperature of the evaporation source 202 achieve a preset temperature; the evaporation source 202 may evaporate gaseous molecules of the evaporation coating material, and the thickness detector 203 may detect the deposition rate of molecules of the evaporation coating material on the substrate E to be coated. When the thickness detector 203 detects that the deposition rate of the molecules of the evaporation coating material on the substrate E to be coated achieves a target rate, it turns on the switch and the motor 207; the motor 207 brings the first supporting rack 205 and the second supporting rack 206 to rotate through the transmission shaft 208, and further brings the substrate E to be coated and the mask board F to rotate; after the switch is turned on, molecules of the evaporation coating material are deposited to the substrate E to be coated sequentially through the switch, the via holes on the film thickness regulator 10 and the mask board F. The deposition rates of the molecules of the evaporation coating material at different positions of the substrate E to be coated can be regulated by the film thickness regulator 10, so that the thickness of the evaporation coating film at different positions of the substrate E to be coated is uniform.

To sum up, embodiments of the present disclosure provide an evaporation apparatus, which comprises a film thickness regulator, and the film thickness regulator is formed by a frame and at least two deformable thin films; voltages are applied to conductive structures on any two deformable thin films in the at least two deformable thin films, making the conductive structures mutually attracted or repulsed, so that the two deformable thin films are moved, and the relative positions of the via holes of two deformable thin films change; when the relative positions of the via holes change, the amount of the evaporation coating material passing through the via holes may be regulated, thus regulating the deposition rates of the evaporation coating material at different positions of the substrate to be coated, so as to make the thickness of the evaporation coating films at different positions of the substrate to be coated uniform, thus solving the problem that the uniformity of the thickness of the evaporation coating films is poor in the related art, and achieving the effect of improving the uniformity of the thickness of the evaporation coating film.

Those of ordinary skill in the art may understand that all or part of the steps for implementing the above embodiments may be realized by hardware, or by a program instructing related hardware; the program may be stored in a computer readable storage medium, which may be ROM, RAM, disk or optical disk and the like.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A film thickness regulator, comprising:
    a frame; and
    at least two thin films disposed in the frame, film surfaces of the at least two thin films parallel to each other, each of the at least two thin films provided with conductive structures and via holes for molecules of an evaporated coating material to pass through;
    wherein when voltages are applied to the conductive structures of any two of the thin films, due to attraction or repulsion between the conductive structures on the two thin films, the two thin films are moved and the relative positions of the via holes on the two thin films change; and
    wherein each thin film is provided with a plurality of the conductive structures arranged in an array and a plurality of the via holes arranged in an array.

2. The film thickness regulator of claim 1, wherein,
    each thin film is provided with a plurality of driving lines, the plurality of driving lines connected to the plurality of conductive structures in a one-to-one correspondence.

3. The film thickness regulator of claim 1, wherein, the structure of each thin is the same.

4. The film thickness regulator of claim 1, wherein, the conductive structures and the via holes on each thin film are arranged alternately.

5. The film thickness regulator of claim 1, wherein, the film surface of each thin film is a rectangular plane; the frame is a rectangular frame; and the least two thin films are sequentially arranged in the frame along a height direction of the frame.

6. The film thickness regulator of claim 5, wherein,
    the conductive structures and the via holes on each thin film are arranged alternately along a length direction of the thin film; or
    the conductive structures and the via holes on each thin film are arranged alternately along a width direction of the thin film.

7. An evaporation apparatus comprising the film thickness regulator of claim 1.

8. The evaporation apparatus of claim 7, further comprising: an evaporation coating chamber, an evaporation source disposed in the evaporation coating chamber, a thickness detector disposed on an inner wall of the evaporation coating chamber and above the evaporation source, a switch disposed in the evaporation coating chamber and above the thickness detector, a first supporting rack and a second supporting rack disposed in the evaporation coating chamber, and a motor disposed external to the evaporation coating chamber, wherein:
    the first supporting rack and the second supporting rack are connected to the motor through a transmission shaft penetrating through the chamber wall of the evaporation coating chamber respectively;
    the first supporting rack is for supporting a substrate to be coated, and the second supporting rack is for supporting a mask board;
    the film thickness regulator is fixed within the evaporation coating chamber and is above the switch and below the second supporting rack; and
    the film thickness regulator is for regulating the deposition rate of molecules of an evaporated coating material on the substrate to be coated by regulating the relative positions of the via holes on the at least two thin films of the film thickness regulator.

9. The evaporation apparatus of claim 8, wherein the evaporation apparatus is configured to:
    apply voltages of the same direction and voltages of opposite directions to a plurality of conductive structures at different corresponding positions on the two thin films alternately, to make the plurality of conductive structures at different corresponding positions on the two thin films mutually attracted and repulsed alternately, so that the two thin films move away from and move towards each other alternatively at different corresponding positions.

10. The evaporation apparatus of claim 7, wherein the evaporation apparatus is further configured to:
    apply voltages to the conductive structures at positions on the two thin films where more evaporated coating material is received, and not apply voltages to the conductive structures at positions on the two thin films where less evaporated coating material is received.

11. A method of manufacturing a film thickness regulator, wherein the film thickness regulator comprises:
    a frame; and
    at least two thin films disposed in the frame, film surfaces of the at least two thin films parallel to each other, each of the at least two thin films provided with conductive structures and via holes for molecules of an evaporated coating material to pass through;
    wherein when voltages are applied to the conductive structures of any two of the thin films, due to attraction or repulsion between the conductive structures on the two thin films, the two thin films are moved and the relative positions of the via holes on the two thin films change; and wherein each thin film is provided with a plurality of conductive structures arranged in an array and a plurality of via holes arranged in an array, the method comprising:

manufacturing the at least two thin films, each of the at least two thin films provided with the conductive structures and the via holes for molecules of an evaporated coating material to pass through; and disposing the at least two deformable thin films in the frame to make the film surfaces of the at least two thin films parallel to each other.

12. The method of manufacturing a film thickness regulator of claim 11, wherein each thin film is further provided with driving lines connected to the conductive structures, and manufacturing the at least two thin films comprises:

forming a thin film layer on a base substrate;

forming the conductive structures and the driving lines on the base substrate formed with the thin film layer, to obtain a thin film to be formed;

stripping off the thin film to be formed from the base substrate; and making holes in the regions other than the conductive structures and the driving lines on the thin film to be formed, so as to form the via holes on the thin film to be formed to obtain a first thin film, the first thin film being any one of the at least two thin films.

13. The method of manufacturing a film thickness regulator of claim 12, wherein forming the conductive structures and the driving lines on the base substrate formed with the thin film layer, to obtain a thin film to be formed comprises:

sequentially forming a metal layer and a photoresist layer on the base substrate formed with the thin film layers;

by exposing and developing the base substrate formed with the photoresist layer by a mask board, forming photoresist patterns which comprise photoresist regions and photoresist-free regions;

removing the metal layer corresponding to the photoresist-free regions by an etching process; and stripping off the photoresist in the photoresist regions, so that the regions of the metal layer corresponding to the photoresist regions form the conductive structures and the driving lines are formed on, to obtain the thin film to be formed.

14. The method of manufacturing a film thickness regulator of claim 12, wherein forming the conductive structures and the driving lines on the base substrate formed with the thin film layer, to obtain a thin film to be formed comprises:

adhering the conductive structures and the driving lines onto the base substrate formed with the thin film layer, to obtain the thin film to be formed.

15. A method of regulating a film thickness using a film thickness regulator, wherein the film thickness regulator comprises:

a frame; and at least two thin films disposed in the frame, film surfaces of the at least two thin films parallel to each other, each of the at least two thin films provided with conductive structures and via holes for molecules of an evaporated coating material to pass through;

wherein when voltages are applied to the conductive structures of any two of the thin films, due to attraction or repulsion between the conductive structures on the two thin films, the two thin films are moved and the relative positions of the via holes on the two thin films change; and wherein each thin film is provided with a plurality of conductive structures arranged in an array and a plurality of via holes arranged in an array, the method comprising:

applying voltages to the conductive structures on any two thin films in the at least two thin films, to make the conductive structures on the two thin films mutually attracted or repulsed, so that the two thin films are moved, and the relative positions of the via holes on the two thin films change, thus changing the amount of the evaporated coating material passing through the via holes, and thereby changing the rate of deposition of the evaporated coating material on a substrate to be coated.

16. The method of regulating a film thickness of claim 15, wherein, applying voltages to conductive structures on any two thin films in the at least two thin films, to make the conductive structures on the two thin films mutually attracted or repulsed, so that the two thin films are moved, and the relative positions of the via holes on the two thin films change, comprises:

applying voltages of the same direction to the conductive structures on the any two thin films in the at least two thin films, to make the conductive structures on the two thin films mutually repulsed, so that the neighboring regions of the conductive structures on the two thin films move away from each other, and the relative positions of the via holes on the two thin films change; or applying voltages of opposite directions to the conductive structures on the any two thin films in the at least two thin films, to make the conductive structures on the any two thin films mutually attracted, so that the neighboring regions of the conductive structures on the two thin films move towards each other, and the relative positions of the via holes on the two thin films change.

17. The method of regulating a film thickness of claim 16, wherein each thin film is provided with a plurality of conductive structures arranged in an array and a plurality of via holes arranged in an array, and applying voltages to the conductive structures on the any two thin films in at least two thin films, to make the conductive structures on the two thin films mutually attracted or repulsed, so that the two thin films are moved, comprises:

applying voltages of the same direction and voltages of opposite directions to the plurality of conductive structures at different corresponding positions on the two thin films alternately, to make the plurality of conductive structures at different corresponding positions on the two thin films mutually attracted and repulsed alternately, so that the two thin films move away from and move towards each other alternatively at different corresponding positions.

18. The method of regulating a film thickness of claim 17, wherein applying voltages to the conductive structures on the any two thin films in at least two thin films, comprises:

applying voltages to the conductive structures at positions on the two thin films where more evaporated coating material is received, and not applying voltages to the conductive structures at positions on the two thin films where less evaporated coating material is received.

* * * * *